US010290561B2

(12) United States Patent
Cetegen et al.

(10) Patent No.: US 10,290,561 B2
(45) Date of Patent: May 14, 2019

(54) THERMAL INTERFACES FOR INTEGRATED CIRCUIT PACKAGES

(71) Applicant: Intel Corporation, Santa Clara, CA (US)

(72) Inventors: Edvin Cetegen, Chandler, AZ (US); Omkar G. Karhade, Chandler, AZ (US); Kedar Dhane, Chandler, AZ (US); Chandra M. Jha, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/279,222

(22) Filed: Sep. 28, 2016

(65) Prior Publication Data

US 2018/0090411 A1    Mar. 29, 2018

(51) Int. Cl.
*H01L 23/367* (2006.01)
*H01L 23/373* (2006.01)
*H01L 23/42* (2006.01)
*H01L 23/427* (2006.01)
*H01L 23/433* (2006.01)

(52) U.S. Cl.
CPC ...... *H01L 23/3736* (2013.01); *H01L 23/3733* (2013.01); *H01L 23/42* (2013.01); *H01L 23/4275* (2013.01); *H01L 23/433* (2013.01)

(58) Field of Classification Search
CPC ............. H01L 23/3731; H01L 23/3675; H01L 23/3736; H01L 23/3737
See application file for complete search history.

(56) References Cited

U.S. PATENT DOCUMENTS

| 7,030,485 B2* | 4/2006 | Houle | H01L 23/3736 257/706 |
| 8,202,765 B2 | 6/2012 | Casey et al. | |
| 2006/0141671 A1* | 6/2006 | Houle | H01L 23/3736 438/122 |

(Continued)

OTHER PUBLICATIONS

Flex & Rigid Flex PCB's, [online] Aug. 28, 2015 [Retrieved Jan. 19, 2017], http://www.epectec.com/flex/, 6 pages.

(Continued)

*Primary Examiner* — Tucker J Wright
*Assistant Examiner* — Wilner Jean Baptiste
(74) *Attorney, Agent, or Firm* — Schwabe, Williamson & Wyatt, P.C.

(57) ABSTRACT

A thermal interface may include a wired network made of a first TIM, and a second TIM surrounding the wired network. A heat spreader lid may include a wired network attached to an inner surface of the heat spreader lid. An IC package may include a heat spreader lid placed over a first electronic component and a second electronic component. A first thermal interface may be formed between the first electronic component and the inner surface of the heat spreader lid, and a second thermal interface may be formed between the second electronic component and the inner surface of the heat spreader lid. The first thermal interface may include a wired network of a first TIM surrounded by a second TIM, while the second thermal interface may include the second TIM, without a wired network of the first TIM. Other embodiments may be described and/or claimed.

13 Claims, 6 Drawing Sheets

(56) References Cited

U.S. PATENT DOCUMENTS

| | | | |
|---|---|---|---|
| 2010/0237496 A1* | 9/2010 | Touzelbaev | ............. H01L 23/42 |
| | | | 257/712 |
| 2013/0309814 A1 | 11/2013 | Too et al. | |
| 2014/0138854 A1* | 5/2014 | Arora | ...................... H01L 23/42 |
| | | | 257/782 |
| 2015/0001701 A1 | 1/2015 | Li et al. | |
| 2016/0197025 A1 | 7/2016 | Bhagwagar et al. | |
| 2017/0117272 A1* | 4/2017 | Sio | ........................ H01L 23/528 |

OTHER PUBLICATIONS

International Search Report and Written Opinion dated Dec. 6, 2017 for International Application No. PCT/US2017/048846, 14 pages.

\* cited by examiner

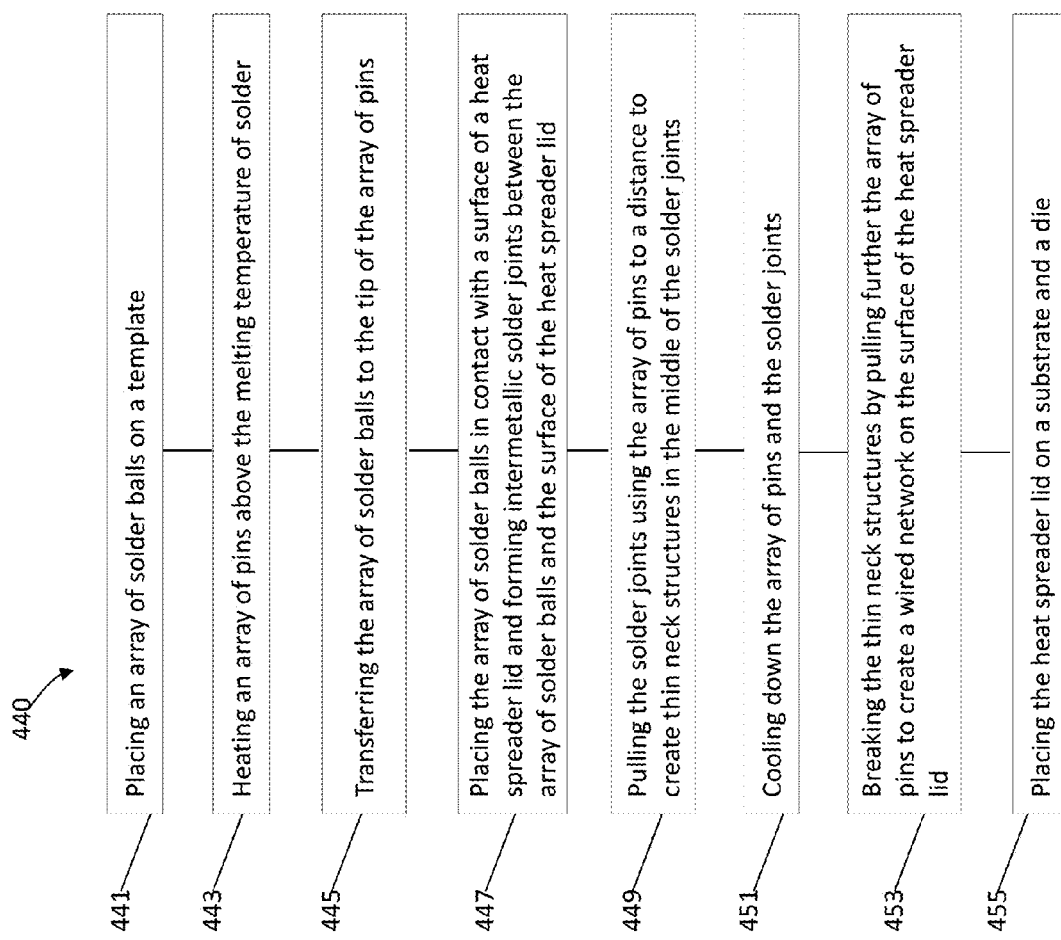

THERMAL INTERFACES FOR INTEGRATED CIRCUIT PACKAGES

TECHNICAL FIELD

The present disclosure relates to the field of electronic circuits. More particularly, the present disclosure relates to thermal interfaces in integrated circuit (IC) packages.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

An electronic component, e.g., an IC chip or a die, may be coupled with other circuits using an IC package that can be attached to a printed circuit board (PCB). An IC package may include different materials with various thermal characteristics. For example, a substrate of an IC package may have a different coefficient of thermal expansion (CTE) than an IC die within the IC package. Thermal behaviors of different materials in an IC package may cause mechanical and thermal stresses, which in turn may lead to package warpage. Package warpage may place stress on the connections of the electronic component, which may in turn lead to detachment and/or physical damage to the electronic component within the IC package. Hence, an IC package may include a heat spreader in the form of a cap or a lid placed over the electronic component to aid in dispersing heat and to reduce package warpage. An electronic component, e.g., a die, may be interfaced with the heat spreader lid by a thermal interface that may conduct heat from the electronic component to the heat spreader lid.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 6 illustrates an example process of attaching a deformable wired network to a heat spreader lid.

DETAILED DESCRIPTION

Figure 1:
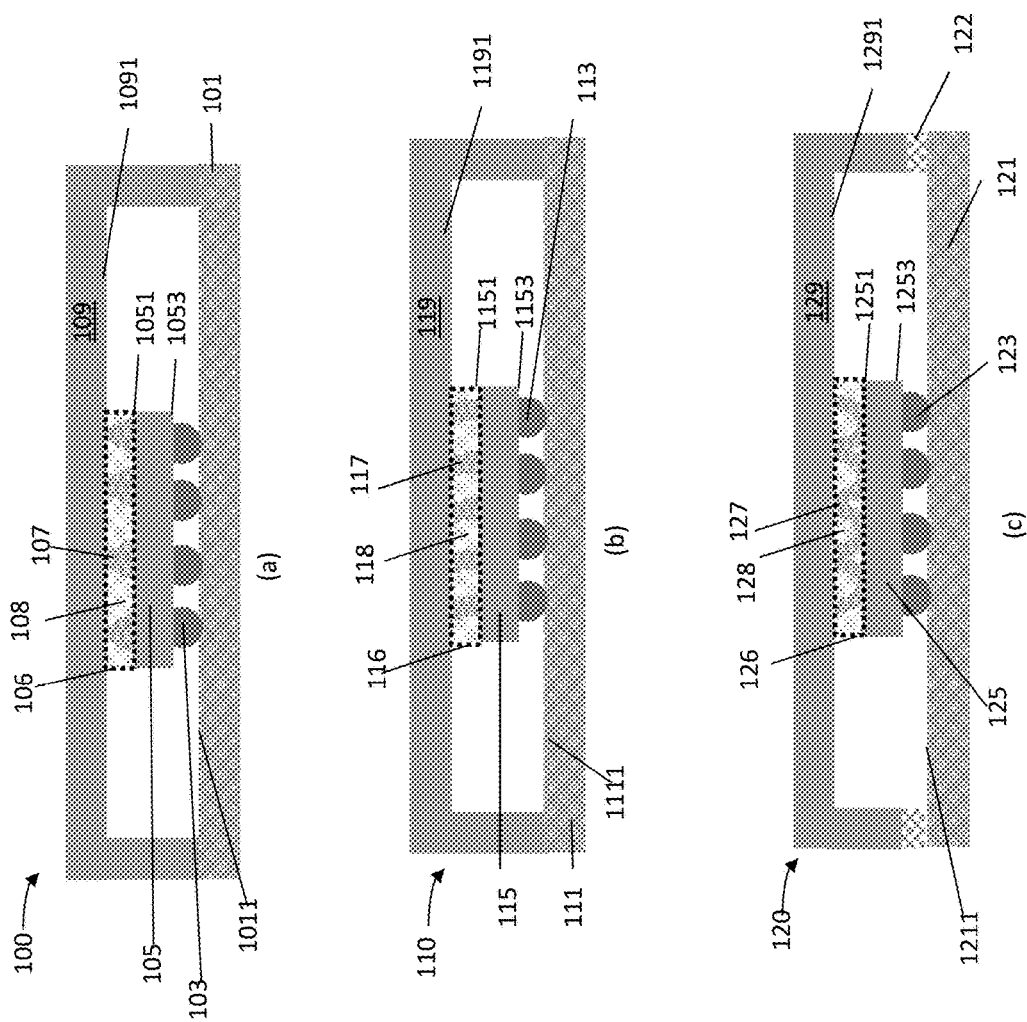
FIGS. 1(a)-1(c) illustrate cross section views of example integrated circuit (IC) packages including a thermal interface between an electronic component and a heat spreader lid, according to various embodiments.

Electronic components, e.g., integrated circuit (IC) chips or dies, may be placed into protective IC packages to allow easy handling and assembly onto printed circuit boards (PCB) and to protect the electronic components from damage. There may be many different types of packages. With the continuous increase in integration of more transistors and functionalities, multi-chip packages (MCPs) may be of interest to place multiple electronic components into a single package. MCPs may enable rich applications in space constrained designs by combining multiple electronic components, such as processors, and/or memory components, into one single package. When multiple electronic components are placed into a single package, the multiple electronic components may be placed in parallel on a common substrate. Additionally or alternatively, the multiple electronic components may be placed one over another in a stacking fashion.

An IC package may include a heat spreader in the form of a cap or a lid, which may be referred to as a heat spreader lid, placed over one or more electronic components to aid in dispersing heat and to reduce the package warpage. An electronic component of an IC package, e.g., a die, may be interfaced with the heat spreader lid by a thermal interface that conducts heat from the electronic component to the heat spreader lid. For a MCP, there may be multiple thermal interfaces between the multiple electronic components within the MCP and the heat spreader lid. Two thermal interfaces of two electronic components within a MCP to a heat spreader lid may have different heights, which may be caused by the different heights of the two electronic components, or caused by the different positions of the two electronic components within the MCP. In some packages, the difference between the heights of two thermal interfaces may be between approximately 50-approximately 400 micrometers (um). If two thermal interfaces of different heights are made of the same or similar thermal interface material (TIM), there may be uneven heat conduction for the two thermal interfaces, which may in turn result in the IC package warpage and place stress on the connections of the electronic components within the IC package. Furthermore, such uneven heat conduction may cause higher die temperature and lower performance for the die with lower thermal conduction.

In embodiments, an IC package may include an electronic component over a substrate, and a heat spreader lid placed over the electronic component and the substrate. A thermal interface may be formed between an inner surface of the heat spreader lid and a surface of the electronic component. The thermal interface may include a wired network made of a first TIM, and a second TIM surrounding the wired network. The first TIM may include a metal, a solder material, copper, aluminum, tin, nickel, gold, silver, iron, steel, or a combination of metal and alloy. The second TIM may include an epoxy resin, a cyanoacrylate, a thermal grease, a thermal gel, a phase-change material, a polymer, or a ceramic material. The wired network may be separated from the inner surface of the heat spreader lid, and/or separated from the electronic component. Additionally or alternatively, the wired network may be in physical contact with the inner surface of the heat spreader lid. For an IC package with such a thermal interface, a majority of the heat may be conducted though the wire network of the thermal interface.

In embodiments, a heat spreader lid may include an inner surface and an outer surface opposite to the inner surface. A wired network may be attached to the inner surface of the heat spreader lid. The wired network may include a TIM, such as a metal, a solder material, copper, aluminum, tin, nickel, gold, silver, iron, steel, or a combination of metal and alloy. The wired network may include a plurality of units, where a unit of the plurality of units may be of a triangle shape, a half circle shape, a circular shape, a rectangle shape, or others. The wired network may be deformable, to change in shape and size when used in a thermal interface.

In embodiments, an IC package may include a first electronic component and a second electronic component over a substrate. A heat spreader lid may be placed over the first electronic component, the second electronic component, and the substrate. A first thermal interface may be formed between the first electronic component and the inner surface of the heat spreader lid, and a second thermal interface may be formed between the second electronic component and the inner surface of the heat spreader lid, where the first thermal interface may have a height larger than a height of the second thermal interface. Additionally or alternatively, the first thermal interface may have a same or similar height as a height of the second thermal interface, while the first electronic component may emit more heat, and hence the first thermal interface may conduct more heat than the second thermal interface does.

The first thermal interface may include a wired network of a first TIM surrounded by a second TIM. On the other hand, the second thermal interface may include the second TIM, without a wired network of the first TIM. The wired network of a first TIM within the first thermal interface may help to conduct heat better than the second TIM alone. Therefore, the time for conducting heat through the first thermal interface from the first electronic component may be similar to the time for conducting heat through the second thermal interface from the second electronic component. In addition, the wired network of the first TIM within the first thermal interface may also provide better physical support for the first electronic component.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The description may use the phrase "communicatively coupled." The phrase may mean that an electrical signal may propagate among the elements that are communicatively coupled.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIGS. 1(a)-1(c) illustrate cross section views of example IC packages, e.g., an IC package 100, an IC package 110, or an IC package 120, including an electronic component, e.g., an electronic component 105, an electronic component 115, or an electronic component 125, and a thermal interface, e.g., a thermal interface 106, a thermal interface 116, or a thermal interface 126, between the electronic component and a heat spreader lid, according to various embodiments. For clarity, features of an IC package, e.g., the IC package 100, the IC package 110, or the IC package 120, may be described below as examples for understanding an example IC package with a thermal interface between an electronic component and a heat spreader lid. It is to be understood that there may be more or fewer components within an IC package. Further, it is to be understood that one or more of the components within the IC package may include additional and/or varying features from the description below, and may include any device that one having ordinary skill in the art would consider and/or refer to as an IC package.

In embodiments, as shown in FIGS. 1(a)-1(c), the IC package 100, the IC package 110, or the IC package 120, may be a chip scale package (CSP), a wafer-level package (WLP), a multi-chip package (WCP), a quad-flat no-leads (QFN) package, a dual-flat no-leads (DFN) package, a flip chip package, or a ball grid array (BGA) package. A CSP may be a flip chip device including solder balls or bumps that are approximately 250 um tall. A wafer-level package may be an IC package at a wafer level, instead of individual dies obtained from dicing them from a wafer. Both QFN and DFN packages may refer to packages that connect ICs to the surfaces of PCBs without through-holes.

FIG. 1(a) illustrates the IC package 100 including a substrate 101, an electronic component 105, and a heat spreader lid 109 placed over the electronic component 105 and the substrate 101. The electronic component 105 may have a surface 1051 and a surface 1053 opposite to the surface 1051. The surface 1053 of the electronic component 105 may be coupled to a surface 1011 of the substrate 101 by a connector 103.

The heat spreader lid 109 may be coupled to the electronic component 105 through a thermal interface 106 between an inner surface 1091 of the heat spreader lid 109 and the surface 1051 of the electronic component 105. The thermal interface 106 may include a wired network 107, which may include a first thermal interface material (TIM). The thermal interface 106 may also include a second TIM 108. In embodiments, the second TIM 108 may surround the wired network 107, and further cover the gap between the inner surface 1091 and the surface 1051.

In embodiments, the substrate 101 may be a polymeric substrate, a non-polymeric substrate, a silicon substrate, a silicon on insulator (SOI) substrate, or a silicon on sapphire (SOS) substrate, among various other substrate materials. In embodiments, the component 105 may include active devices, or passive devices such as capacitors, resistors. For example, the component 105 may be a chip for a processor, a memory chip, a radio frequency (RF) chip, or others. The heat spreader lid 109 may be placed on the surface 1011 of the substrate 101, over the electronic component 105, so that the electronic component 105 is placed in an enclosure formed by the heat spreader lid 109 and the substrate 101. In embodiments, the heat spreader lid 109 may have a shape of a frame or ring, e.g., a rectangular ring, a circular ring, or other ring shape. The heat spreader lid 109 may be made from a metal, such as stainless steel, copper, and/or other material.

The surface 1053 of the electronic component 105 may be coupled to the surface 1011 of the substrate 101 by the connector 103. One or more such connectors may be used to make the connection between the electronic component 105 and the substrate 101. In embodiments, the connector 103 may be a stud, a wire-bonding wire, a bump, a ball, a solder pillar, or others. For example, the connector 103 may include one or more solder balls, where the solder balls may include solder alloy such as tin-lead (Sn—Pb) solders or lead free solders such as tin/silver/copper or some other lead-free solder. In addition, an underfill layer may be between the electronic component 105 and the substrate 101, not shown for simplicity reasons.

In embodiments, the thermal interface 106 between the inner surface 1091 of the heat spreader lid 109 and the surface 1051 of the electronic component 105 may include the wired network 107 surrounded by the second TIM 108. In embodiments, the first TIM for the wired network 107 may include a metal, a solder material, copper, aluminum, tin, nickel, gold, silver, iron, steel, or a combination of metal and alloy. In embodiments, the second TIM 108 may include an epoxy resin, a cyanoacrylate, a thermal grease, a thermal gel, a phase-change material, a polymer, or a ceramic material.

In embodiments, the wired network 107 may be in physical contact with the inner surface 1091 of the heat spreader lid 109. In addition, the wired network 107 may also be in physical contact with the surface 1051 of the electronic component 105. In embodiments, the wired network 107 may be completely within an enclosure of the surface 1051 and a corresponding portion of the inner surface 1091 of the heat spreader lid 109. Additionally or alternatively, the wired network 107 may be separated from the inner surface 1091 of the heat spreader lid 109, and separated from the surface 1051 of the electronic component 105.

In embodiments, the wired network 107 may include a plurality of units, where a unit may be of a triangle shape as shown in FIG. 1(a). Additionally or alternatively, a unit may be of a half circle shape, a circular shape, or a rectangle shape, or a twisted rectangle shape, as shown in FIG. 1(b) and FIG. 1(c). There may be many other shapes of the unit of the wired network 107 not shown. The wired network 107 may be deformable, that it may be of a different shape or size after the wired network 107 is included into the thermal interface 106. More details of examples of the wired network 107 may be illustrated in FIGS. 3(a)-3(d), and FIG. 4.

FIG. 1(b) illustrates the IC package 110 including a substrate 111, an electronic component 115, and a heat spreader lid 119 placed over the electronic component 115 and the substrate 111. The detailed description for each part of the IC package 110 may be similar to the description of a similar part for the IC package 100.

For example, the electronic component 115 may have a surface 1151 and a surface 1153 opposite to the surface 1151. The surface 1153 of the electronic component 115 may be coupled to a surface 1111 of the substrate 111 by a connector 113. The heat spreader lid 119 may be coupled to the electronic component 115 through a thermal interface 116 between an inner surface 1191 of the heat spreader lid 119 and the surface 1151 of the electronic component 115. The thermal interface 116 may include a wired network 117, which may include a first thermal interface material (TIM). The thermal interface 116 may also include a second TIM 118. In embodiments, the second TIM 118 may surround the wired network 117. In embodiments, the wired network 117 may include a plurality of units, where a unit may be of a twisted rectangle shape.

FIG. 1(c) illustrates the IC package 120 including a substrate 121, an electronic component 125, and a heat spreader lid 129 placed over the electronic component 125 and the substrate 121. The detailed description for each part of the IC package 120 may be similar to the description of a similar part for the IC package 100.

For example, the electronic component 125 may have a surface 1251 and a surface 1253 opposite to the surface 1251. The surface 1253 of the electronic component 125 may be coupled to a surface 1211 of the substrate 121 by a connector 123. The heat spreader lid 129 may be coupled to the electronic component 125 through a thermal interface 126 between an inner surface 1291 of the heat spreader lid 129 and the surface 1251 of the electronic component 125. The thermal interface 126 may include a wired network 127, which may include a first thermal interface material (TIM). The thermal interface 126 may also include a second TIM 128. In embodiments, the second TIM 128 may surround the wired network 127. In embodiments, the wired network 127 may include a plurality of units, where a unit may be of a half circle shape. In addition, the heat spreader lid 129 may not be in direct contact with the substrate 121. Instead, an adhesive 122 may be in between the spreader lid 129 and the substrate 121.

Figure 2:
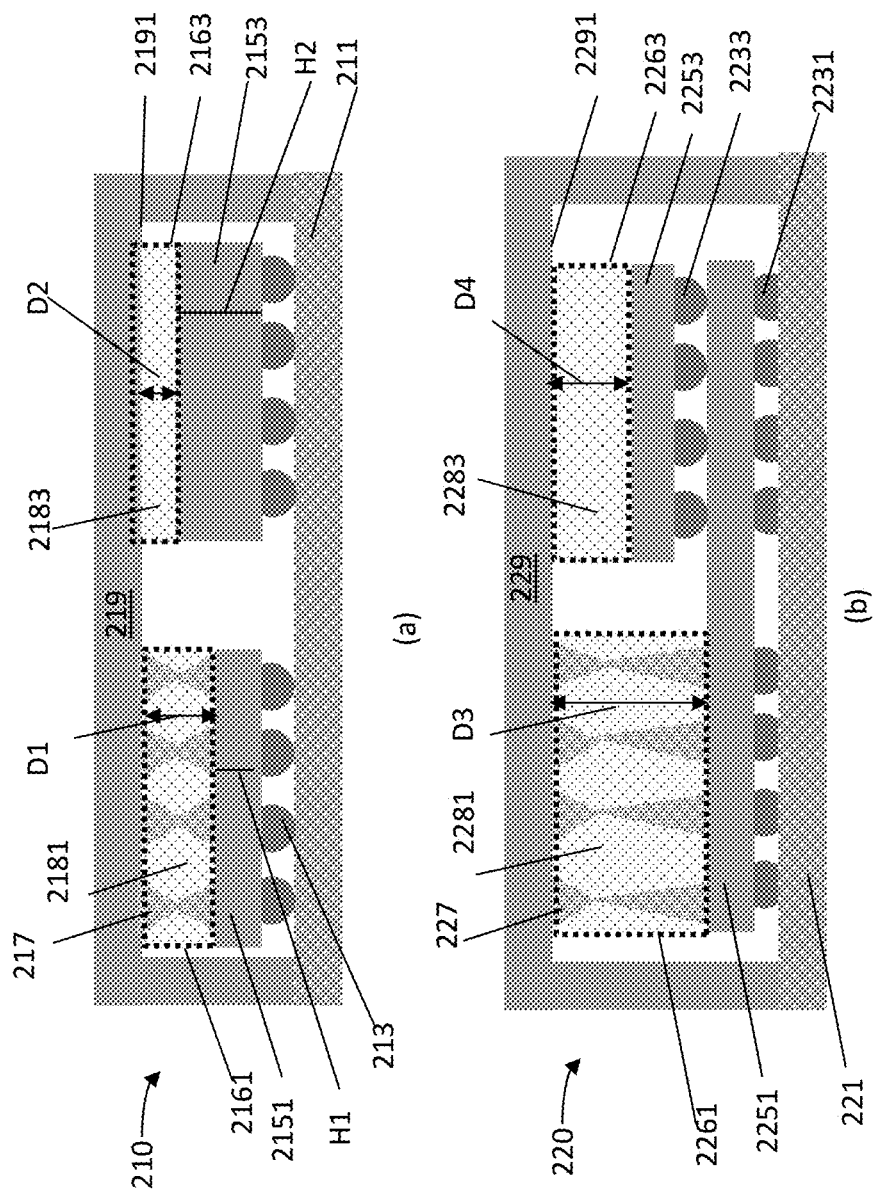
FIGS. 2(a)-2(b) illustrate cross section views of example IC packages including multiple thermal interfaces between multiple electronic components and a heat spreader lid, according to various embodiments.
Figure 3:
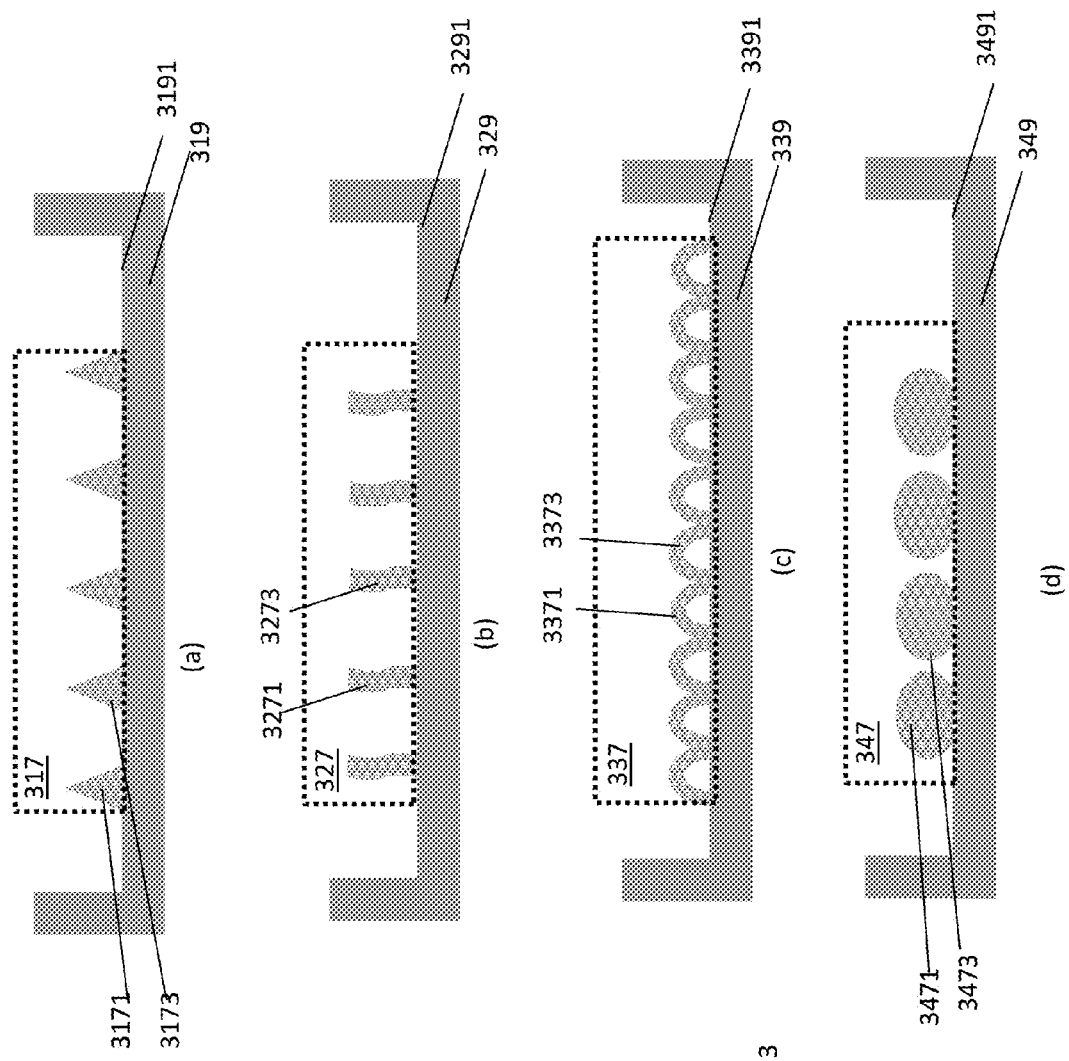
FIGS. 3(a)-3(d) illustrate cross section views of example heat spreader lids with a wired network, according to various embodiments.
Figure 4:
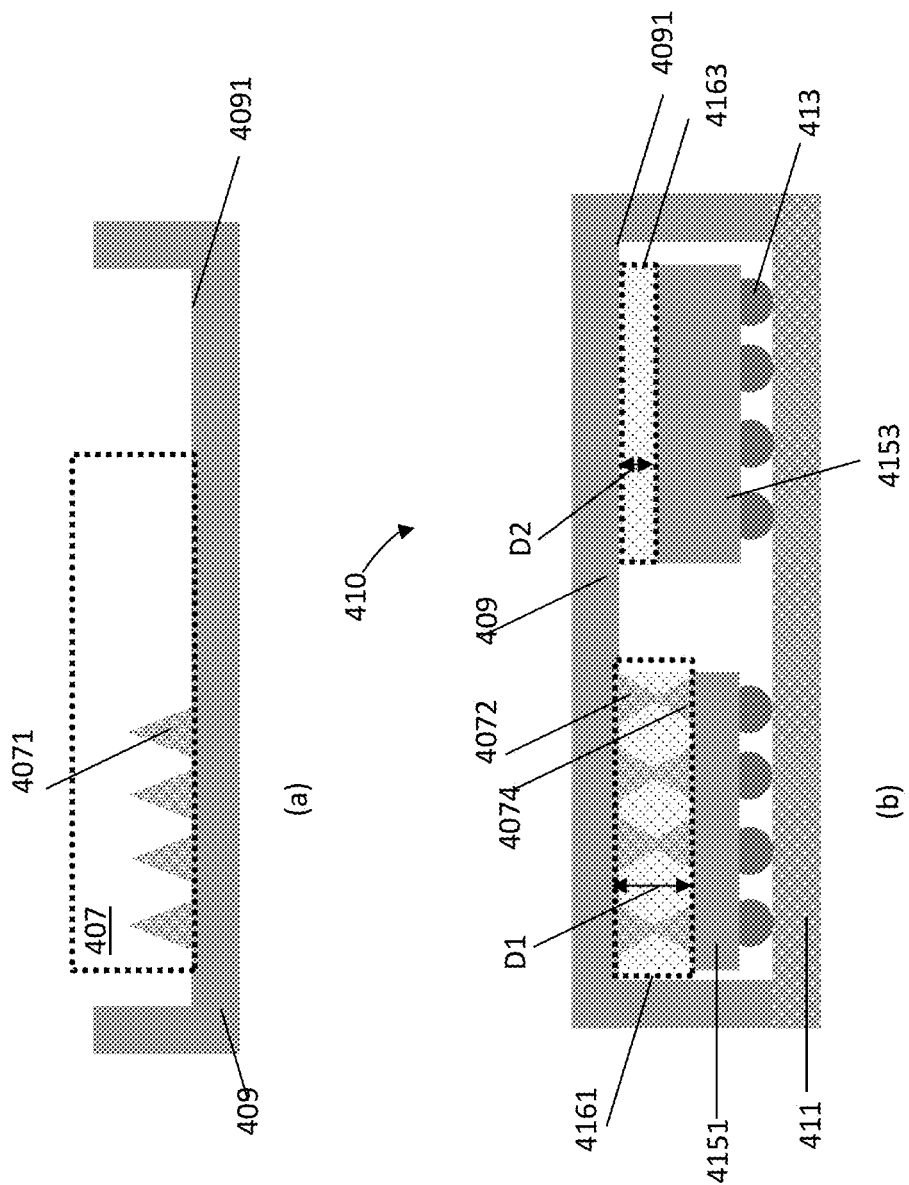
FIGS. 4(a)-4(b) illustrate cross section views of an example application of a heat spreader lid with a deformable wired network as a part of a thermal interface in an IC package, according to various embodiments.

FIGS. 2(a)-2(b) illustrate cross section views of example IC packages, e.g., an IC package 210, or an IC package 220, including multiple electronic components and multiple thermal interfaces between the electronic components and a heat spreader lid, according to various embodiments. For example, the IC package 210 may include an electronic component 2151 having a thermal interface 2161, and an electronic component 2153 having a thermal interface 2163. The IC package 220 may include an electronic component 2251 having a thermal interface 2261, and an electronic component 2253 having a thermal interface 2263. For clarity, features of an IC package, e.g., the IC package 210, or the IC package 220, may be described below as examples for understanding an example IC package with a thermal interface between multiple electronic components and a heat spreader lid. It is to be understood that there may be more or fewer components with an IC package. Further, it is to be understood that one or more of the components within the IC package may include additional and/or varying features from the description below, and may include any device that one having ordinary skill in the art would consider and/or refer to as an IC package.

FIG. 2(a) illustrates the IC package 210 including a substrate 211, the electronic component 2151, the electronic component 2153, and a heat spreader lid 219 placed over the electronic component 2151, the electronic component 2153, and the substrate 211. The electronic component 2151 and the electronic component 2153 may be placed in parallel on the substrate 211, and coupled to the substrate 211 by connectors 213. The heat spreader lid 219 may be coupled to the electronic component 2151 through the thermal interface 2161 connecting an inner surface 2191 of the heat spreader lid 219 to a surface of the electronic component 2151, and coupled to the electronic component 2153 through the thermal interface 2163 connecting the inner surface 2191 of the heat spreader lid 219 to a surface of the electronic component 2153.

In embodiments, the thermal interface 2161 may have a height D1, and the thermal interface 2163 may have a height D2, where D1 may be larger than D2. The difference between D1 and D2 may be caused by a difference in the height H1 of the electronic component 2151, and the height H2 of the electronic component 2153. In some embodiments, the difference between D1 and D2, or similarly between H1 and H2, may be in a range of approximately 50 to approximately 400 um. If the thermal interface 2161 and the thermal interface 2163 have a same structure, the heat may take longer time to reach the heat spreader lid 219 from the electronic component 2151 through the thermal interface 2161 because the thermal interface 2161 has larger height, compared to the time to reach the heat spreader lid 219 from the electronic component 2153 through the thermal interface 2163. The uneven time for heat to travel through the thermal interface 2161 and the thermal interface 2163 may result in stress to part of the package 210, further causing damages to the package 210.

In embodiments, the thermal interface 2161 may include a wired network 217 of a first TIM surrounded by a second TIM 2181. On the other hand, the thermal interface 2163 may include a TIM 2183, without a wired network of the first TIM. In embodiments, the TIM 2183 may be same or similar to the second TIM 2181. The wired network 217 within the thermal interface 2161 may help to conduct heat better than the second TIM 2181 alone. Therefore, the time for conducting heat through the thermal interface 2161 from the electronic component 2151 may be similar to the time for conducting heat through the thermal interface 2163 from the electronic component 2153. In addition, the wired network 217 of the first TIM within the thermal interface 2161 may also provide better physical support for the electronic component 2151.

In embodiments, the first TIM for the wired network 217 may be a material that conducts heat faster than the second TIM 2181, or the TIM 2183, so that the overall time for conducting heat through the thermal interface 2161 from the electronic component 2151 may be similar to the time for conducting heat through the thermal interface 2163 from the electronic component 2153. For example, the first TIM for the wired network 217 may include a metal, a solder material, copper, aluminum, tin, nickel, gold, silver, iron, steel, or a combination of metal and alloy; while the second TIM 2181 and/or the TIM 2183 may include an epoxy resin, a cyanoacrylate, a thermal grease, a thermal gel, a phase-change material, a polymer, or a ceramic material.

FIG. 2(b) illustrates the IC package 220 including a substrate 221, the electronic component 2251, the electronic component 2253, and a heat spreader lid 229 placed over the electronic component 2251, the electronic component 2253, and the substrate 221. The electronic component 2251 and the electronic component 2253 may be in a stacking fashion that the electronic component 2253 is placed over the electronic component 2251, while the electronic component 2251 is placed over the substrate 221. The heat spreader lid 229 may be coupled to the electronic component 2251 through the thermal interface 2261 connecting an inner surface 2291 of the heat spreader lid 229 to a surface of the electronic component 2251, and coupled to the electronic component 2253 through the thermal interface 2263 connecting the inner surface 2291 of the heat spreader lid 229 to a surface of the electronic component 2253.

In embodiments, the thermal interface 2261 may have a height D3, and the thermal interface 2263 may have a height D4, where D3 may be larger than D4. The difference between D3 and D4 may be caused by the positions of the electronic component 2251 and the electronic component 2253, while the electronic component 2251 and the electronic component 2253 may have a same or similar height. In some embodiments, the difference between D3 and D4 may be in a range of between approximately 50 and approximately 400 um.

In embodiments, the thermal interface 2261 may include a wired network 227 of a first TIM surrounded by a second TIM 2281. On the other hand, the thermal interface 2263 may include a TIM 2283, without a wired network of the first TIM. In embodiments, the TIM 2283 may be same or similar to the second TIM 2281. The wired network 227 within the thermal interface 2261 may help to conduct heat better than the second TIM 2281 alone. Therefore, the time for conducting heat through the thermal interface 2261 from the electronic component 2251 may be similar to the time for conducting heat through the thermal interface 2263 from the electronic component 2253. In embodiments, the first TIM for the wired network 227 may be a material that conducts heat faster than the second TIM 2281, or the TIM 2283, so that the overall time for conducting heat through the thermal interface 2261 from the electronic component 2251 may be similar to the time for conducting heat through the second thermal interface 2263 from the electronic component 2253.

In embodiments, additionally or alternatively, a first thermal interface, e.g., the thermal interface 2261, may have a same or similar height as a height of a second thermal interface, e.g., the thermal interface 2263, but the electronic component, e.g., the electronic component 2251, may emit more heat, and hence the first thermal interface, e.g., the thermal interface 2261, may conduct more heat than the second thermal interface.

FIGS. 3(a)-3(d) illustrate cross section views of example heat spreader lids, e.g. a heat spreader lid 319, a heat spreader lid 329, a heat spreader lid 339, or a heat spreader lid 349, with a wired network, e.g., a wired network 317, a wired network 327, a wired network 337, or a wired network 347, according to various embodiments. The heat spreader lid, e.g., the heat spreader lid 319, the heat spreader lid 329, the heat spreader lid 339, or the heat spreader lid 349, may be similar to the heat spreader lid 109, 119, or 129 in FIG. 1, or the heat spreader lid 219 or 229 in FIG. 2.

FIG. 3(a) illustrates the heat spreader lid 319 with the wired network 317 attached to an inner surface 3191. In embodiments, the heat spreader lid 319 may be placed over an electronic component and a substrate, e.g., placed over the electronic component 105 and the substrate 101 as shown in FIG. 1(a). The wired network 317 may be part of a thermal interface, e.g., the thermal interface 106 of the IC package 100 as shown in FIG. 1(a).

In embodiments, the wired network 317 may include a plurality of units, e.g., a unit 3171, and a unit 3173. The unit 3171 and the unit 3173 may be of a triangle shape. The unit 3171 and the unit 3173 may be separated from each other with a gap in between. Additionally or alternatively, the unit 3171 and the unit 3173 may be in contact with each other. The wired network 317 may include a metal, a solder material, copper, aluminum, tin, nickel, gold, silver, iron, steel, or a combination of metal and alloy.

FIG. 3(b) illustrates the heat spreader lid 329 with the wired network 327 attached to an inner surface 3291. In embodiments, the wired network 327 may include a plurality of units, e.g., a unit 3271, and a unit 3273. The unit 3271 and the unit 3273 may be of a rectangle shape, or a twisted rectangle shape. The unit 3271 and the unit 3273 may be separated from each other with a gap in between. Additionally or alternatively, the 3271 and the unit 3273 may be in contact with each other. The wired network 327 may include a metal, a solder material, copper, aluminum, tin, nickel, gold, silver, iron, steel, or a combination of metal and alloy.

FIG. 3(c) illustrates the heat spreader lid 339 with the wired network 337 attached to an inner surface 3391. In embodiments, the wired network 337 may include a plurality of units, e.g., a unit 3371, and a unit 3373. The unit 3371 and the unit 3373 may be of a half circle shape. The unit 3371 and the unit 3373 may be separated from each other with a gap in between. Additionally or alternatively, the 3371 and the unit 32373 may be in contact with each other. The wired network 337 may include a metal, a solder material, copper, aluminum, tin, nickel, gold, silver, iron, steel, or a combination of metal and alloy.

FIG. 3(d) illustrates the heat spreader lid 349 with the wired network 347 attached to an inner surface 3491. In embodiments, the wired network 347 may include a plurality of units, e.g., a unit 3471, and a unit 3473. The unit 3471 and the unit 3473 may be of a circular shape. The unit 3471 and the unit 3473 may be separated from each other with a gap in between. Additionally or alternatively, the 3471 and the unit 3473 may be in contact with each other. The wired network 347 may include a metal, a solder material, copper, aluminum, tin, nickel, gold, silver, iron, steel, or a combination of metal and alloy.

In addition, the wired network attached to a heat spreader lid, e.g., the wired network 317, the wired network 327, the wired network 337, or the wired network 347, may be deformable. More details are illustrated in FIGS. 4(a)-4(b).

FIGS. 4(a)-4(b) illustrate cross section views of an example application of a heat spreader lid, e.g., the heat spreader lid 409, with a wired network, e.g., the wired network 407, to be used to form a thermal interface in an IC package, e.g., the thermal interface 4161, according to various embodiments. The heat spreader lid 409 may be similar to the heat spreader lid 109, 119, or 129 in FIG. 1, the heat spreader lid 219 or 229 in FIG. 2, or the heat spreader lid 319, 329, 339, or 349 in FIG. 3.

In embodiments, the wired network 407 may include a plurality of units of various shapes, as shown in FIGS. 3(a)-3(d). A unit, e.g., a unit 4071, of the wired network 407 may be deformable. For example, in the process of forming a thermal interface, the unit 4071 may change its height, width, shape, or others. In this way, a heat spreader lid 409 may be able to be applied to package different electronic components with different heights, increasing the flexibility of the applications for the heat spreader lid.

For example, the heat spreader lid 409 may be applied to form an IC package 410. The IC package 410 may include a substrate 411, an electronic component 4151, and an electronic component 4153. The heat spreader lid 409 may be placed over the electronic component 4151, the electronic component 4153, and the substrate 411, where a thermal interface 4161 may be formed between the heat spreader lid 409 and the electronic component 4151, and a thermal interface 4163 may be formed between the heat spreader lid 409 and the electronic component 4153. In embodiments, the thermal interface 4161 may have a height D1, and the thermal interface 4163 may have a height D2, where D1 may be larger than D2. The wired network 407 may be a part of the thermal interface 4161. In forming the thermal interface 4161, a unit 4071 of the wired network 407 may change its shape, from a triangle shape of the unit 4071 to include two parts, a part 4072, and another part 4074 to be contained within the thermal interface 4161. There may be other forms of changes for the unit 4071 of the wired network 407, not shown for simplicity reasons.

Figure 5:
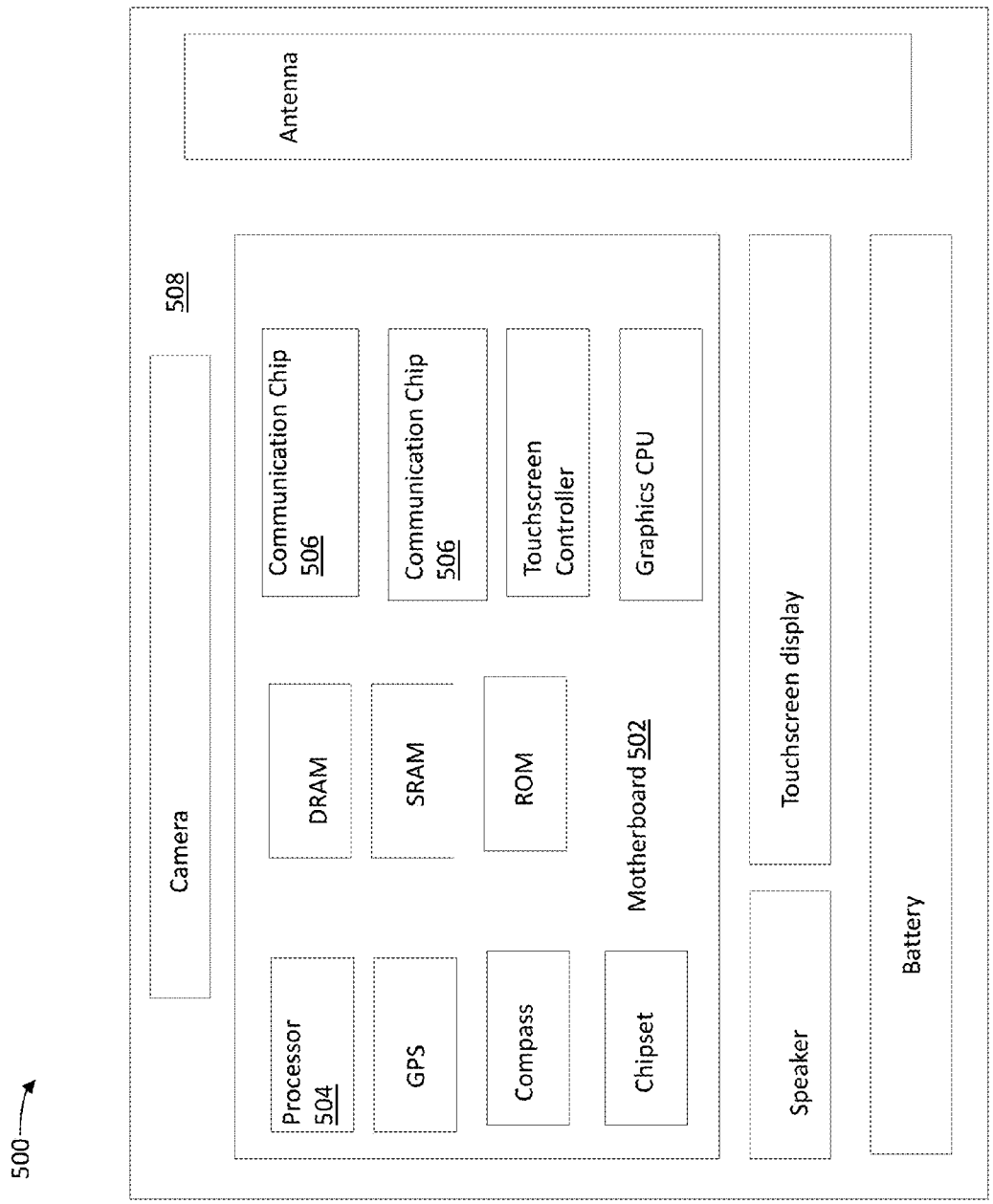
FIG. 5 illustrates an example computing device that may employ the apparatuses and/or methods described herein, according to various embodiments.

FIG. 5 illustrates an example computer device 500 that may employ the apparatuses and/or methods described herein (e.g., an electronic system assembled on a PCB with IC packages, e.g., the IC package 100, the IC package 110, the IC package 120, the IC package 210, the IC package 220, or the IC package 410), in accordance with various embodiments. Components of the computing device 500 may be housed in an enclosure (e.g., housing 508). The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics central processing unit (CPU), a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). These components may be included in IC packages, e.g., the IC package 100, the IC package 110, the IC package 120, the IC package 210, the IC package 220, or the IC package 410. The components, such as the processor 504, the communication chip 506, DRAM, ROM, GPS, may have different heights.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, EV-DO, and others.

In various implementations, the computing device 500 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

FIG. 6 illustrates an example process 440 of forming a deformable wired network on a surface of a heat spreader lid, according to various embodiments. The process 440 may be applied to form the wired network 407 on the heat spreader lid 409.

In operation 441, the process 440 may include placing an array of solder balls on a template. In operation 443, the process 440 may include heating an array of pins above the melting temperature of solder. In operation 445, the process 440 may include transferring the array of solder balls to the tip of the array of pins. In operation 447, the process 440 may include placing the array of solder balls in contact with a surface of a heat spreader lid and forming intermetallic solder joints between the array of solder balls and the surface of the heat spreader lid. In operation 449, the process 440 may include pulling the solder joints using the array of pins to a distance to create thin neck structures in the middle of the solder joints. In operation 451, the process 440 may include cooling down the array of pins and the solder joints. In operation 453, the process 440 may include breaking the thin neck structures by pulling further the array of pins to create a wired network on the surface of the heat spreader lid. In operation 455, the process 440 may include placing the heat spreader lid on a substrate and a die.

Some non-limiting Examples are provided below.

Example 1 may include an integrated circuit (IC) package, comprising: a substrate; an electronic component having a first surface and a second surface opposite to the first surface, wherein the first surface is coupled to a surface of the substrate by a connector; and a heat spreader lid over the electronic component and the substrate, wherein the heat spreader lid is coupled to the electronic component through a thermal interface between an inner surface of the heat spreader lid and the second surface, and the thermal interface includes: a wired network of a first thermal interface material (TIM); and a second TIM, wherein the second TIM surrounds the wired network.

Example 2 may include the IC package of example 1 and/or some other examples herein, wherein the wired network is deformable.

Example 3 may include the IC package of example 1 and/or some other examples herein, wherein the first TIM includes a metal, a solder material, copper, aluminum, tin, nickel, gold, silver, iron, steel, or a combination of metal and alloy.

Example 4 may include the IC package of example 1 and/or some other examples herein, wherein the second TIM includes an epoxy resin, a cyanoacrylate, a thermal grease, a thermal gel, a phase-change material, a polymer, or a ceramic material.

Example 5 may include the IC package of example 1 and/or some other examples herein, wherein the wired network is separated from the inner surface of the heat spreader lid, and the wired network is separated from the second surface.

Example 6 may include the IC package of example 1 and/or some other examples herein, wherein the wired network is in physical contact with the inner surface of the heat spreader lid.

Example 7 may include the IC package of any of examples 1-6 and/or some other examples herein, wherein the wired network is completely within an enclosure of the second surface and a corresponding portion of the inner surface of the heat spreader lid.

Example 8 may include the IC package of any of examples 1-6 and/or some other examples herein, wherein the connector between the first surface and the surface of the substrate is a stud, a wire-bonding wire, a bump, a ball, or a solder pillar.

Example 9 may include the IC package of any of examples 1-6 and/or some other examples herein, wherein the IC package is a chip scale package (CSP), a wafer-level package (WLP), a multi-chip package (WCP), a quad-flat no-leads (QFN) package, a dual-flat no-leads (DFN) package, a flip chip package, or a ball grid array (BGA) package.

Example 10 may include the IC package of any of examples 1-6 and/or some other examples herein, wherein the electronic component is a first electronic component, the thermal interface between the inner surface of the heat spreader lid and the second surface is a first thermal interface, and the IC package further includes: a second electronic component between the substrate and the heat spreader lid, wherein the second electronic component has a third surface coupled to the inner surface of the heat spreader lid by a second thermal interface, the second thermal interface includes a third TIM same as the second TIM of the first thermal interface, and a first distance between the inner surface of the heat spreader lid and the second surface is larger than a second distance between the inner surface of the heat spreader lid and the third surface.

Example 11 may include the IC package of example 10 and/or some other examples herein, wherein the second electronic component has a fourth surface coupled to the surface of the substrate, and the second electronic component is placed on the surface of the substrate in parallel with the first electronic component.

Example 12 may include the IC package of example 10 and/or some other examples herein, wherein the second electronic component is placed between the second surface and the inner surface of the heat spreader lid, and has a fourth surface coupled to a portion of the second surface.

Example 13 may include the IC package of example 10 and/or some other examples herein, wherein a difference between the first distance and the second distance is between about 50 micrometers (um) and about 400 um.

Example 14 may include an electronic device, comprising: a heat spreader lid, wherein the heat spreader lid includes an inner surface and an outer surface opposite to the inner surface; and a deformable wired network attached to the inner surface of the heat spreader lid, wherein the wired network includes a first thermal interface material (TIM).

Example 15 may include the electronic device of example 14 and/or some other examples herein, wherein the first TIM includes a metal, a solder material, copper, aluminum, tin, nickel, gold, silver, iron, steel, or a combination of metal and alloy.

Example 16 may include the electronic device of example 14 and/or some other examples herein, wherein the wired network includes a plurality of units, a unit of the plurality of units is of a triangle shape, a half circle shape, a circular shape, or a rectangle shape.

Example 17 may include the electronic device of example 16 and/or some other examples herein, wherein a first unit of the plurality of units is connected to a second unit of the plurality of units of the wired network.

Example 18 may include the electronic device of any of examples 14-16 and/or some other examples herein, further including: a substrate; and an electronic component having a first surface and a second surface opposite to the first surface, wherein the first surface is coupled to a surface of the substrate by a connector, the heat spreader lid is over the electronic component and the substrate, the heat spreader lid is coupled to the electronic component through a thermal interface between the inner surface of the heat spreader lid and the second surface, and the thermal interface includes the wired network, and a second TIM, wherein the second TIM surrounds the wired network.

Example 19 may include the electronic device of example 18 and/or some other examples herein, wherein the second TIM includes an epoxy resin, a cyanoacrylate, a thermal grease, a thermal gel, a phase-change material, a polymer, or a ceramic material.

Example 20 may include the electronic device of example 18 and/or some other examples herein, wherein the connector between the first surface and the surface of the substrate is a stud, a wire-bonding wire, a bump, a ball, or a solder pillar.

Example 21 may include the electronic device of example 18 and/or some other examples herein, wherein the electronic device is a chip scale package (CSP), a wafer-level package (WLP), a multi-chip package (WCP), a quad-flat no-leads (QFN) package, a dual-flat no-leads (DFN) package, a flip chip package, or a ball grid array (BGA) package.

Example 22 may include an electronic system, comprising: a printed circuit board (PCB); and an integrated circuit (IC) package affixed to the PCB, wherein the IC package includes: a substrate; an electronic component having a first surface and a second surface opposite to the first surface, wherein the first surface is coupled to a surface of the substrate by a connector; and a heat spreader lid over the electronic component and the substrate, wherein the heat spreader lid is coupled to the electronic component through a thermal interface between an inner surface of the heat spreader lid and the second surface, and the thermal interface includes: a wired network of a first thermal interface material (TIM), wherein the wired network is deformable; and a second TIM, wherein the second TIM surrounds the wired network.

Example 23 may include the electronic system of example 22 and/or some other examples herein, wherein the electronic component is a first electronic component, the thermal interface between the inner surface of the heat spreader lid and the second surface is a first thermal interface, and the IC package further includes: a second electronic component between the substrate and the heat spreader lid, wherein the second electronic component has a third surface coupled to the inner surface of the heat spreader lid by a second thermal interface, the second thermal interface includes a third TIM same as the second TIM of the first thermal interface, and a distance between the inner surface of the heat spreader lid and the second surface is larger than a distance between the inner surface of the heat spreader lid and the third surface.

Example 24 may include the electronic system of any of examples 22-23 and/or some other examples herein, wherein the second electronic component has a fourth surface coupled to the surface of the substrate, and the second electronic component is placed on the surface of the substrate in parallel with the first electronic component.

Example 25 may include the electronic system of any of examples 22-23 and/or some other examples herein, wherein the second electronic component is placed between the second surface and the inner surface of the heat spreader lid, and has a fourth surface coupled to a portion of the second surface.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An integrated circuit (IC) package, comprising:
   a substrate;
   an electronic component having a first surface and a second surface opposite to the first surface, wherein the first surface is coupled to a surface of the substrate by a connector;
   a heat spreader lid over the electronic component and the substrate; and
   a thermal interface disposed between an inner surface of the heat spreader lid and the second surface of the electronic component, to couple the heat spreader lid to the electronic component, wherein the thermal interface includes:
   a wired network of a first thermal interface material (TIM), wherein the wired network includes a plurality of deformable units having a triangle shape prior to a formation of the wired network, wherein in response to the formation of the wired network the units deform to change their shape to include a first part of the triangular shape and a second part of the triangular shape, wherein a sharp end of the first part interfaces a sharp end of the second part, wherein the first and second parts of the units are contained within the thermal interface; and
   a second TIM, wherein the second TIM surrounds the wired network.

2. The IC package of claim 1, wherein the wired network is deformable.

3. The IC package of claim 1, wherein the first TIM includes a metal, a solder material, copper, aluminum, tin, nickel, gold, silver, iron, steel, or a combination of metal and alloy.

4. The IC package of claim 1, wherein the second TIM includes an epoxy resin, a cyanoacrylate, a thermal grease, a thermal gel, a phase-change material, a polymer, or a ceramic material.

5. The IC package of claim 1, wherein the wired network is separated from the inner surface of the heat spreader lid, and the wired network is separated from the second surface of the electronic component.

6. The IC package of claim 1, wherein the wired network is in physical contact with the inner surface of the heat spreader lid.

7. The IC package of claim 1, wherein the wired network is completely within an enclosure of the second surface of the electronic component and a corresponding portion of the inner surface of the heat spreader lid.

8. The IC package of claim 1, wherein the connector between the first surface of the electronic component and the surface of the substrate is a stud, a wire-bonding wire, a bump, a ball, or a solder pillar.

9. The IC package of claim 1, wherein the IC package is a chip scale package (CSP), a wafer-level package (WLP), a multi-chip package (WCP), a quad-flat no-leads (QFN) package, a dual-flat no-leads (DFN) package, a flip chip package, or a ball grid array (BGA) package.

10. The IC package of claim 1, wherein the electronic component is a first electronic component, the thermal interface between the inner surface of the heat spreader lid and the second surface is a first thermal interface, and the IC package further includes:

a second electronic component between the substrate and the heat spreader lid, wherein the second electronic component has a third surface coupled to the inner surface of the heat spreader lid by a second thermal interface, the second thermal interface includes a third TIM same as the second TIM of the first thermal interface, and a first distance between the inner surface of the heat spreader lid and the second surface is larger than a second distance between the inner surface of the heat spreader lid and the third surface.

11. The IC package of claim 10, wherein the second electronic component has a fourth surface coupled to the surface of the substrate, and the second electronic component is placed on the surface of the substrate in parallel with the first electronic component.

12. The IC package of claim 10, wherein the second electronic component is placed between the second surface and the inner surface of the heat spreader lid, and has a fourth surface coupled to a portion of the second surface.

13. The IC package of claim 10, wherein a difference between the first distance and the second distance is between about 50 micrometers (um) and about 400 um.

\* \* \* \* \*